United States Patent
Jeon

[19]

[11] Patent Number: 6,153,909
[45] Date of Patent: Nov. 28, 2000

[54] SEMICONDUCTOR DEVICE AND METHOD FOR FABRICATING THE SAME

[75] Inventor: Yongjoon Jeon, Kyungki-do, Rep. of Korea

[73] Assignee: LG Electronics Inc., Seoul, Rep. of Korea

[21] Appl. No.: 09/217,202

[22] Filed: Dec. 22, 1998

[30] Foreign Application Priority Data

Dec. 23, 1997 [KR] Rep. of Korea ................. 97/72515
Jun. 10, 1998 [KR] Rep. of Korea ................. 98/21555

[51] Int. Cl.$^7$ .................. H01L 29/76; H01L 29/94; H01L 31/062; H01L 31/113; H01L 31/119
[52] U.S. Cl. .................. 257/336; 257/333; 257/355
[58] Field of Search ................. 257/408, 344, 257/336, 395, 401, 387, 412, 333, 339, 355

[56] References Cited

U.S. PATENT DOCUMENTS

| | | | |
|---|---|---|---|
| 5,338,960 | 8/1994 | Beasom | 257/335 |
| 5,659,197 | 8/1997 | Wei | 257/588 |
| 5,793,085 | 8/1998 | Vajana et al. | 257/370 |
| 5,834,793 | 11/1998 | Shibata | 257/25 |
| 5,864,160 | 1/1999 | Buynoski | 257/339 |
| 5,952,701 | 9/1999 | Bulucea et al. | 257/407 |

FOREIGN PATENT DOCUMENTS 4-326524  11/1992  Japan ................. 257/344

OTHER PUBLICATIONS

Tasch et al. "Limitations of LDD Types of Structures in Deep–Submicrometer MOS Technology" IEEE Electron Device Letters, vol. 11, No. II, Nov. 1990, pp. 517–519.

Primary Examiner—Sheila V. Clark
Attorney, Agent, or Firm—Fleshner & Kim, LLP

[57] ABSTRACT

Semiconductor device and a method for fabricating the same, which is suitable for reducing a hot carrier effect, the device including a first conduction type substrate, a gate insulating film formed on a region of the first conduction type substrate, a gate electrode formed on the gate insulating film, second conduction type impurity regions formed in regions of the substrate on both sides of the gate electrode, a barrier block formed in a portion of each of the second conduction type impurity regions, and source/drain electrodes formed in contact with the second conduction type impurity regions, respectively.

22 Claims, 8 Drawing Sheets

SEMICONDUCTOR DEVICE AND METHOD FOR FABRICATING THE SAME

BACKGROUND OF THE INVENTION

1. Field of the Invention

The present invention relates to a semiconductor device, and more particularly, to a semiconductor device and a method for fabricating the same, which is suitable for reducing a hot carrier effect.

2. Background of the Related Art

Figure 1:
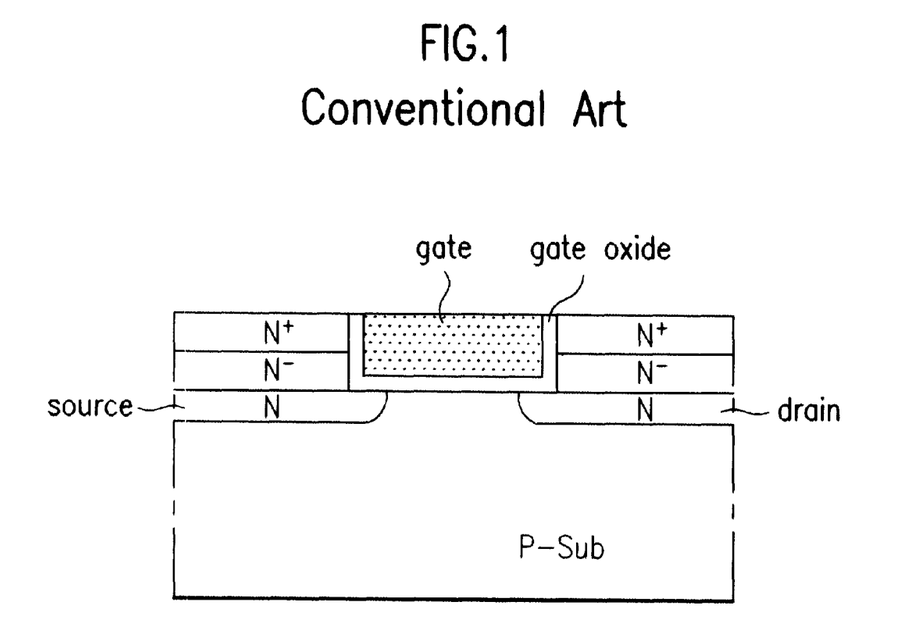
FIGS. 1, 2 and 3 illustrate sections showing structures of related art MOSFETs.
Figure 2:
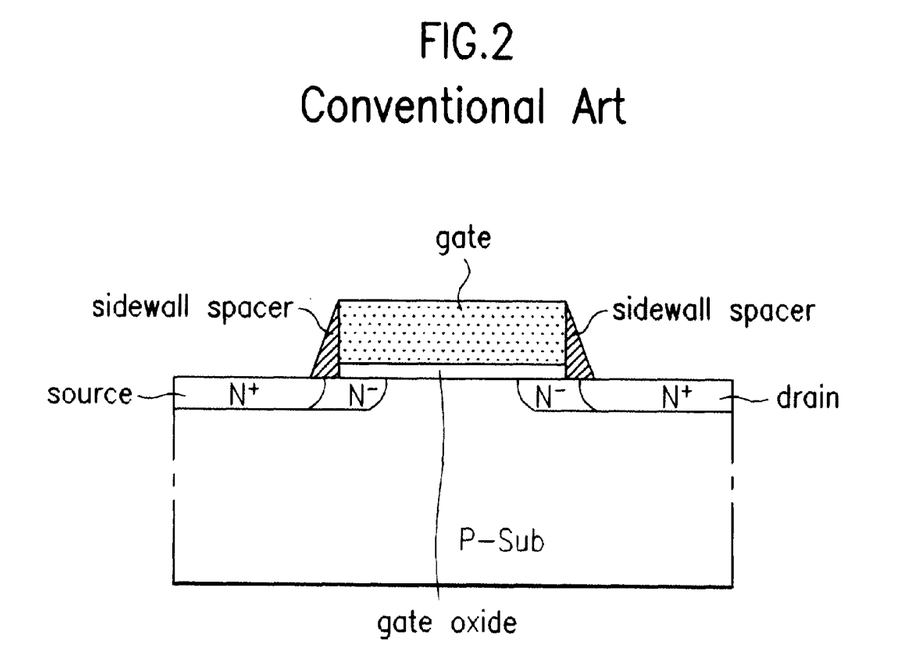

In general, short channel device employs an LDD(Lightly Doped Drain) structure for reducing the hot carrier effect. In the LDD, an electric field between a drain and a channel is reduced for reducing electron injection into, collision onto an oxide layer, and ionization and hot carrier effect. Related art structures employed for reducing the hot carrier effect will be explained with reference to the attached drawings. FIG. 1 illustrates a structure provided for reducing the hot carrier effect, wherein an N layer is formed on a drain/source junction to increase a resistance of a drain region for reducing an electric field. However, actual fabrication of the structure by using an existing silicon process is difficult because the structure has a complicated drain/source structure. FIG. 2 illustrates a structure for reducing the hot carrier effect by employing the LDD structure together with a gate fringing effect. The gate fringing effect is an electric field leakage through a periphery of a gate electrode which becomes the greater as a size of an MOSFET device becomes the smaller. If LDD sidewall spacers formed of a material having a high electric permittivity, such as silicon nitride($Si_3N_4$), are provided at both sides of the gate electrode, enhancing the gate fringing effect further, the electric field in the drain region can be reduced. However, because the material with a high electric permittivity, such as silicon nitride employed for using the gate fringing effect, has a band gap substantially smaller than a silicon oxide of a gate oxide film, the hot carrier is liable to be injected to the gate oxide film, that accelerates a device degradation, if the material with a high electric permittivity is used as the sidewall spacers. To prevent this, an additional silicon oxide film is formed between the gate and the sidewall spacer, which leads the fabrication process complicated.

Figure 3:
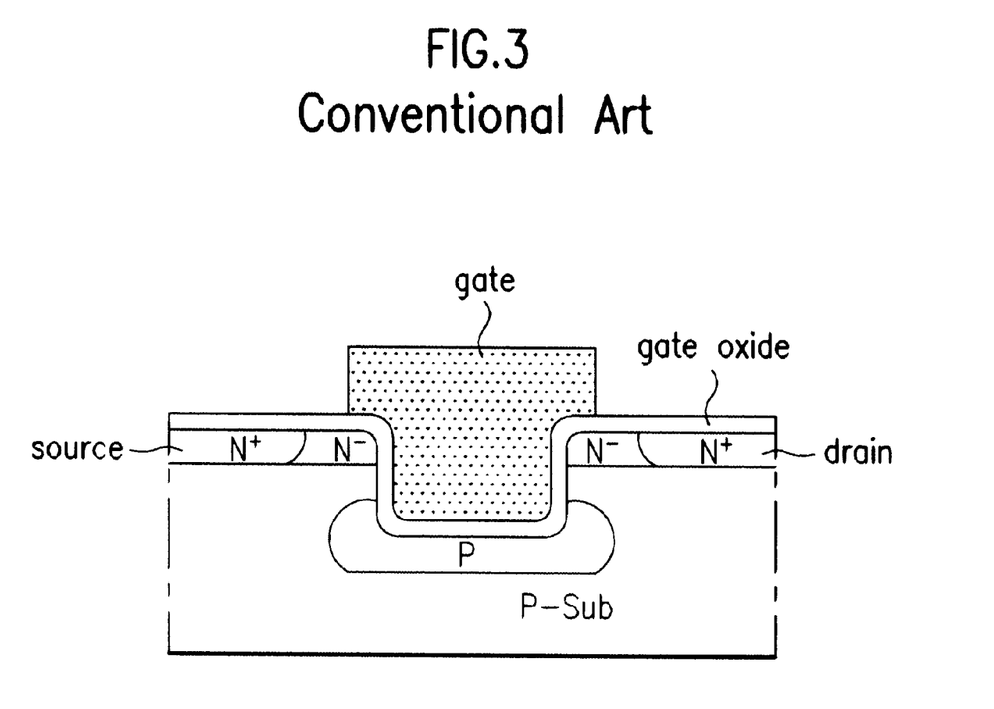

FIG. 3 illustrates a section of an MOSFET with a bent channel. An electric potential barrier is formed at the bent portion of the channel, which decreases an energy of the carrier passing through the barrier and reduces the hot carrier effect. However, this structure also has a problem of a complicated fabrication process due to the structure.

SUMMARY OF THE INVENTION

Accordingly, the present invention is directed to a semiconductor device and a method for fabricating the same that substantially obviates one or more of the problems due to limitations and disadvantages of the related art.

An object of the present invention is to provide a semiconductor device and a method for fabricating the same, which can reduce the hot carrier effect.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor device having a gate electrode, a source electrode, and a drain electrode all of which are over a substrate, includes source/drain regions in regions of the substrate on both sides of the gate electrode, and a barrier block formed in a portion of each of the source/drain regions.

In other aspect of the present invention, there is provided a semiconductor device including a first conduction type substrate, a gate insulting film formed on a region of the first conduction type substrate, a gate electrode formed on the gate insulating film, second conduction type impurity regions formed in regions of the substrate on both sides of the gate electrode, a barrier block formed in a portion of each of the second conduction type impurity regions, and source/drain electrodes formed in contact with the second conduction type impurity regions, respectively.

In another aspect of the present invention, there is provided a method for fabricating a semiconductor device, including the steps of (1) forming a gate insulting film on a region of a first conduction type substrate and a gate electrode on the gate insulating film, (2) injecting second conduction type impurity ions into the first conduction type substrate using the gate electrode as a mask, to form source/drain regions in regions of the substrate on both sides of the gate electrode, (3) forming sidewall spacers at both sides of the gate electrode, (4) injecting ions selected from oxygen, nitrogen, and a first conduction type impurity ions using the gate electrode and the sidewall spacers as a mask into a portion in each of surfaces of the source and the drain, to form a barrier block therein, and (5) forming source/drain electrode to be in contact with the source/drain regions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings. FIGS. 4a–4d illustrate sections showing the steps of a method for fabricating an MOSFET in accordance with a preferred embodiment of the present invention, and FIG. 5 illustrates a section showing an MOSFET in accordance with a preferred embodiment of the present invention.

Figure 4A:
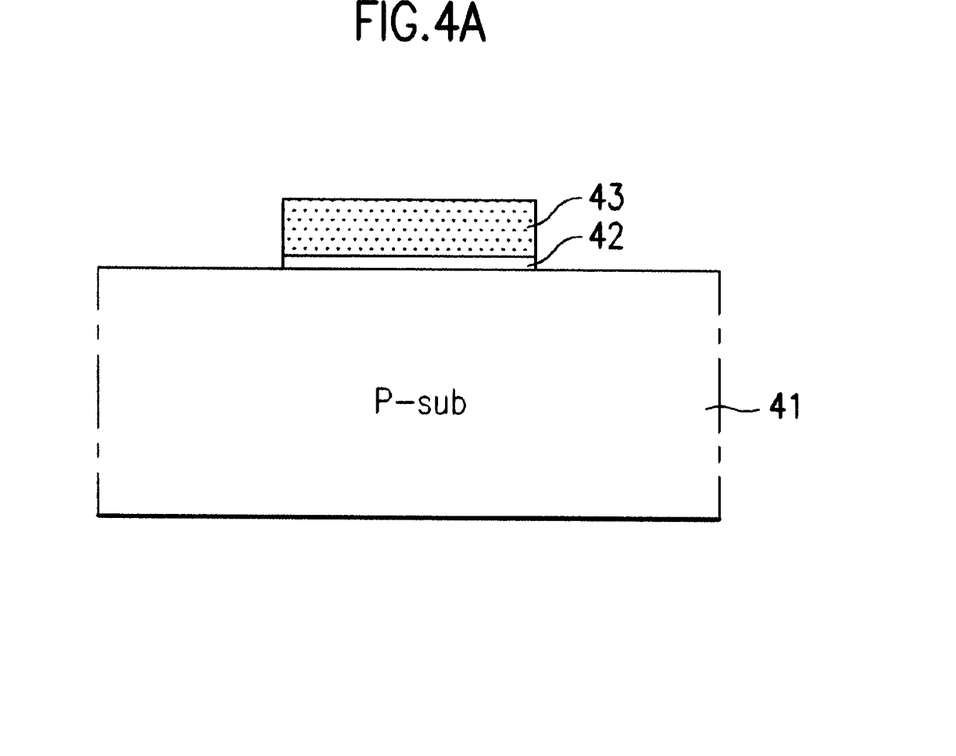
FIGS. 4a~4d illustrate sections showing the steps of a method for fabricating an MOSFET in accordance with a preferred embodiment of the present invention.
Figure 4B:
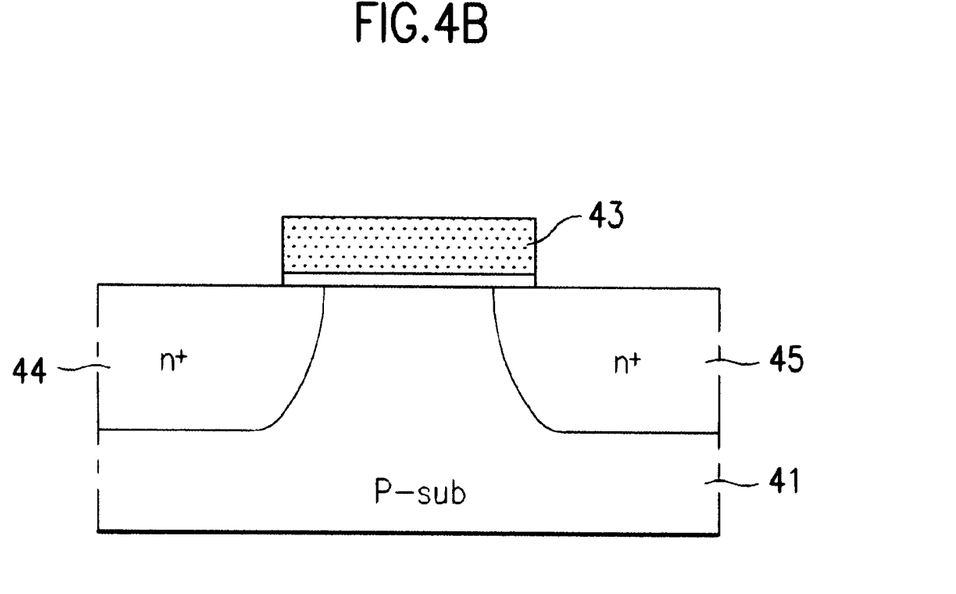
Figure 4C:
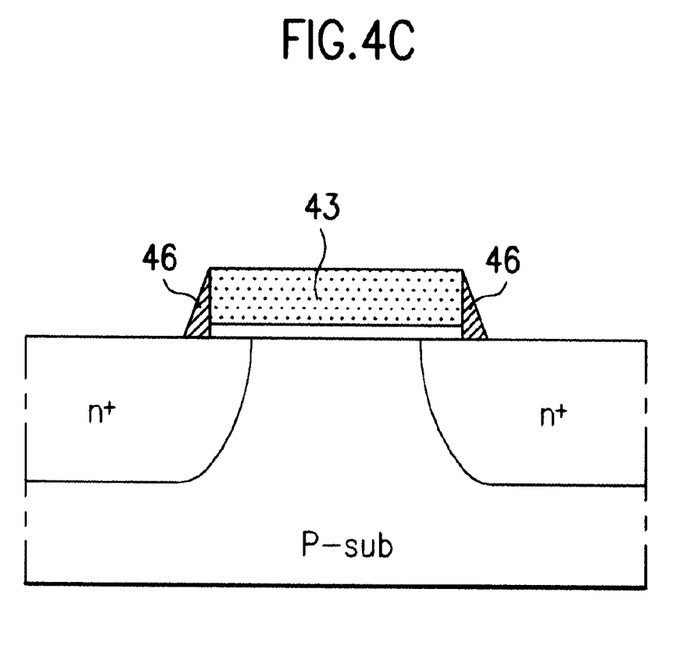
Figure 4D:
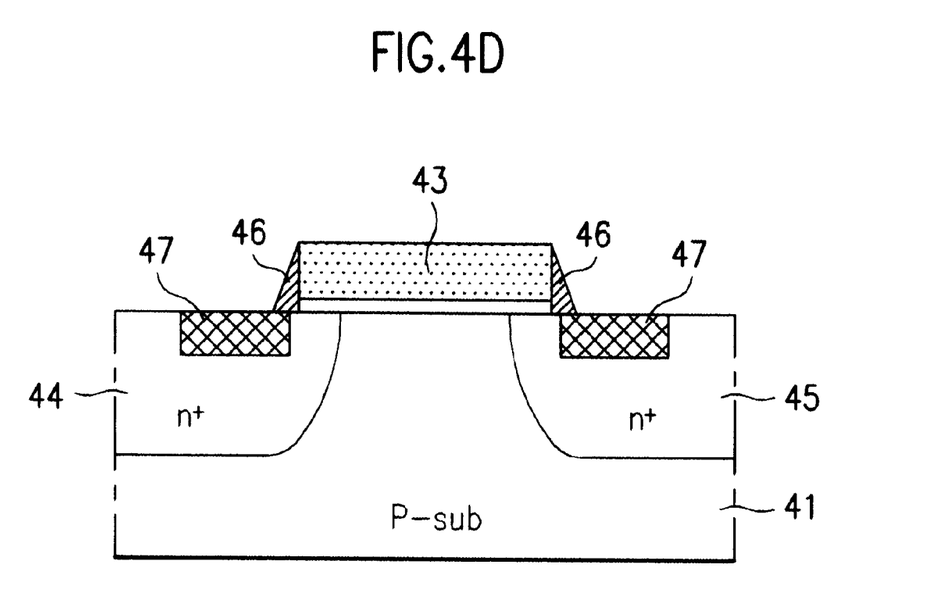

Referring to FIG. 4a, a gate oxide film 42 is deposited on a region of a p type substrate 41 and a gate electrode 43 is formed on the gate oxide film 42. As shown in FIG. 4b, n type impurity ions are injected to form a source 44 and a drain 45 in a surface of the substrate 41 on both sides of the gate electrode 43. Then, as shown in FIG. 4c, sidewall spacers 46 of silicon oxide($SiO_2$) are formed at sides of the gate electrode 43, and, as shown in FIG. 4d, the gate electrode 43 and the sidewall spacers 46 are used as a mask for injecting ions selected from oxygen, nitrogen, and p type impurity ions into a portion in each of surfaces of the source 44 and the drain 45, to form a barrier block 47 with a depth, therein. That is, the barrier block 47 is formed either by injecting ions of oxygen or nitrogen to form an insulating body with a high electric permittivity, such as silicon oxide ($SiO_2$) or silicon nitride($Si_3N_4$), or by doping with impurity of a type opposite to the impurity of the source/drain regions. Then, a source electrode. and a drain electrode(not shown) to be in contact with the source 44 and the drain 45 having the barrier blocks formed therein are formed, respectively.

A semiconductor device with such barrier blocks substantially reduces generation of hot carriers because the device is involved in an electric field reduction due to the gate fringing effect as shown in the structure of FIG. 2 and has a current path formed around each of the barrier blocks that causes a series resistance greater. As the barrier block 47 of an insulating body with a high electric permittivity increases an electric field fringing in the vicinity of edges of the drain 45, the hot carrier effect can be reduced, significantly. That is, the high field fringing effect of the insulating body of the silicon oxide or the silicon nitride in the vicinity of the barrier block reduces a high electric field in the vicinity of a drain junction, thereby suppressing generation of the hot carriers. And, because a barrier block 47 doped with an impurity opposite to a type of an impurity doped in the source/drain, which is another embodiment of the present invention, acts as a barrier against a carrier flow, the barrier block 47 can suppress generation of the hot carrier. In order to make the barrier block 47 to act as a barrier against the hot carrier, the doping into the barrier region should be adequate to have a barrier height higher than approx. 0.5 eV. However, since the barrier block formed by impurity doping has an electric permittivity the same with the silicon, though the electric filed reduction effect as high as a field fringing caused by a barrier block of an insulating body can not be expected, the barrier block formed by impurity doping is easy to use compared to the barrier block of the insulating body because the barrier block formed by impurity doping can be formed by using a doping process used in an existing MOS fabrication process. Though embodiments of the present invention take the cases of general MOSFETs as examples, the present invention is not limited to this, but applicable even to an LDD MOSFET.

Figure 5:
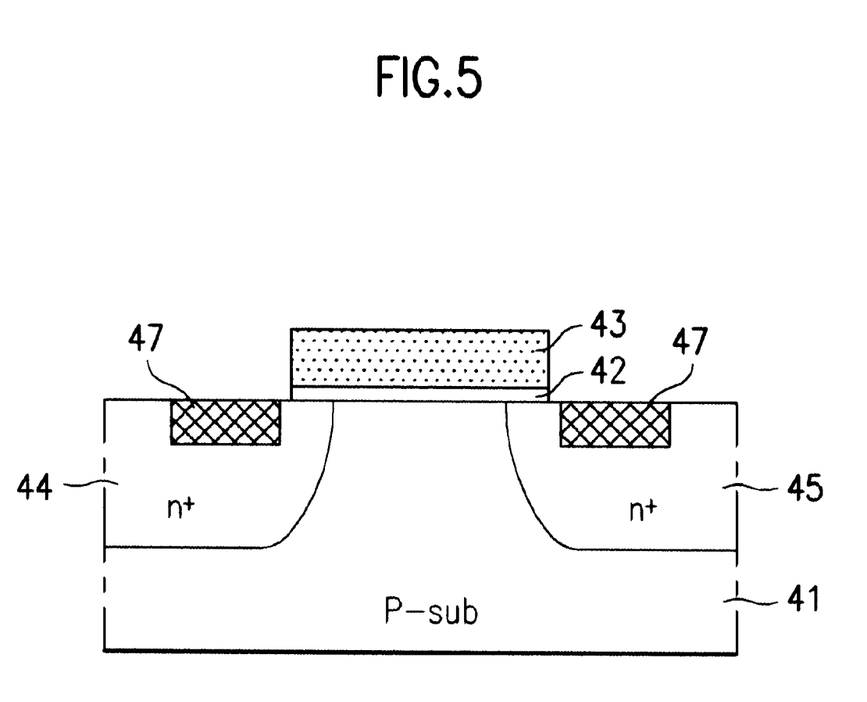
FIG. 5 illustrates a section showing an MOSFET in accordance with a preferred embodiment of the present invention.

FIG. 5 illustrates a section showing an MOSFET in accordance with a preferred embodiment of the present invention.

Referring to FIG. 5, the MOSFET in accordance with a preferred embodiment of the present invention includes a gate insulating film 42 on a region of a p type substrate 41, a gate electrode 43 on the gate insulating film 42, a source 44 and a drain 45 in surfaces of the substrate 41 on both sides of the gate electrode 44, a barrier block 47 in a portion of each of the surfaces of the source 44 and the drain 45, and a source electrode and a drain electrode(not shown) in contact with the source 44 and the drain 45, respectively.

Figure 6:
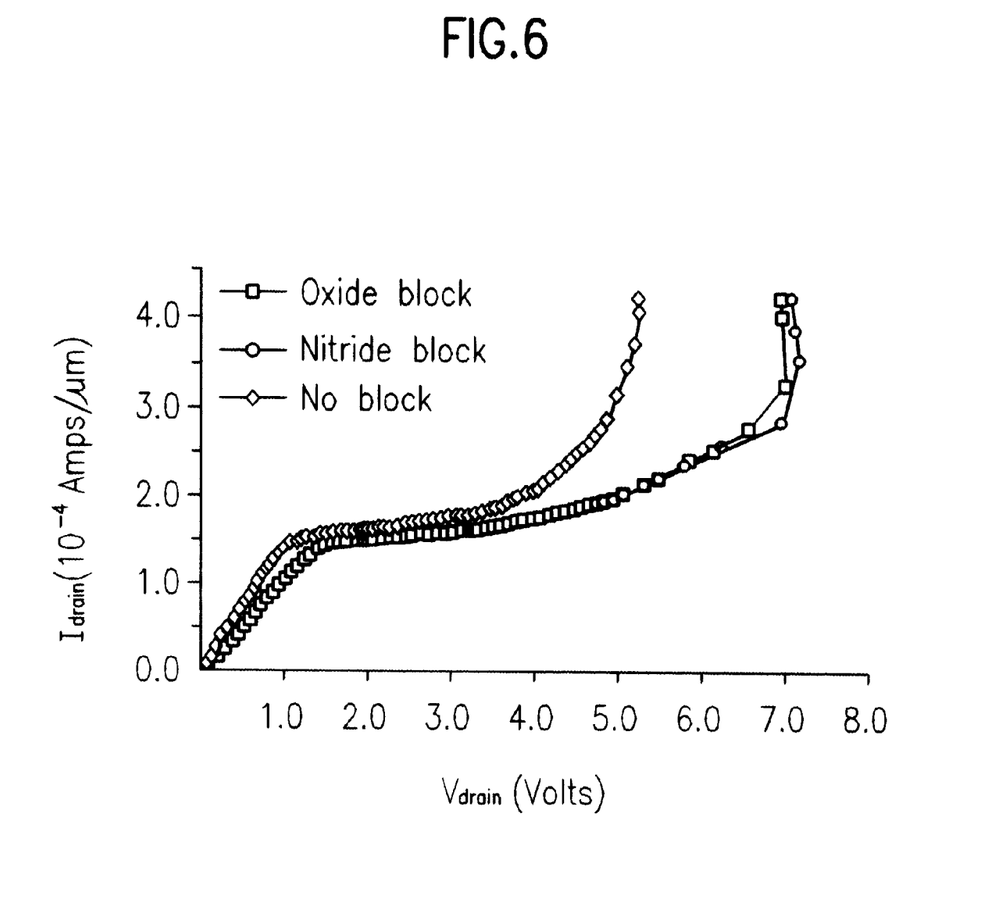
FIG. 6 illustrates a graph showing a comparison of drain characteristics of a related art LDD MOSFET without a barrier block and an MOSFET of the present invention with a barrier block.

FIG. 6 illustrates a graph showing a comparison of currents vs. voltages of drains of a related art LDD MOSFET without a barrier block and an MOSFET of the present invention with a barrier block. The gate voltage applied herein is approx. 2V.

Referring to FIG. 6, it can be known that the MOSFET of the present invention with a barrier block has a device breakdown voltage coming later than the related art LDD MOSFET by more than 2V. This is because the carriers are difficult to obtain energies in the channel field, with a less impact ionization caused.

Figure 7:
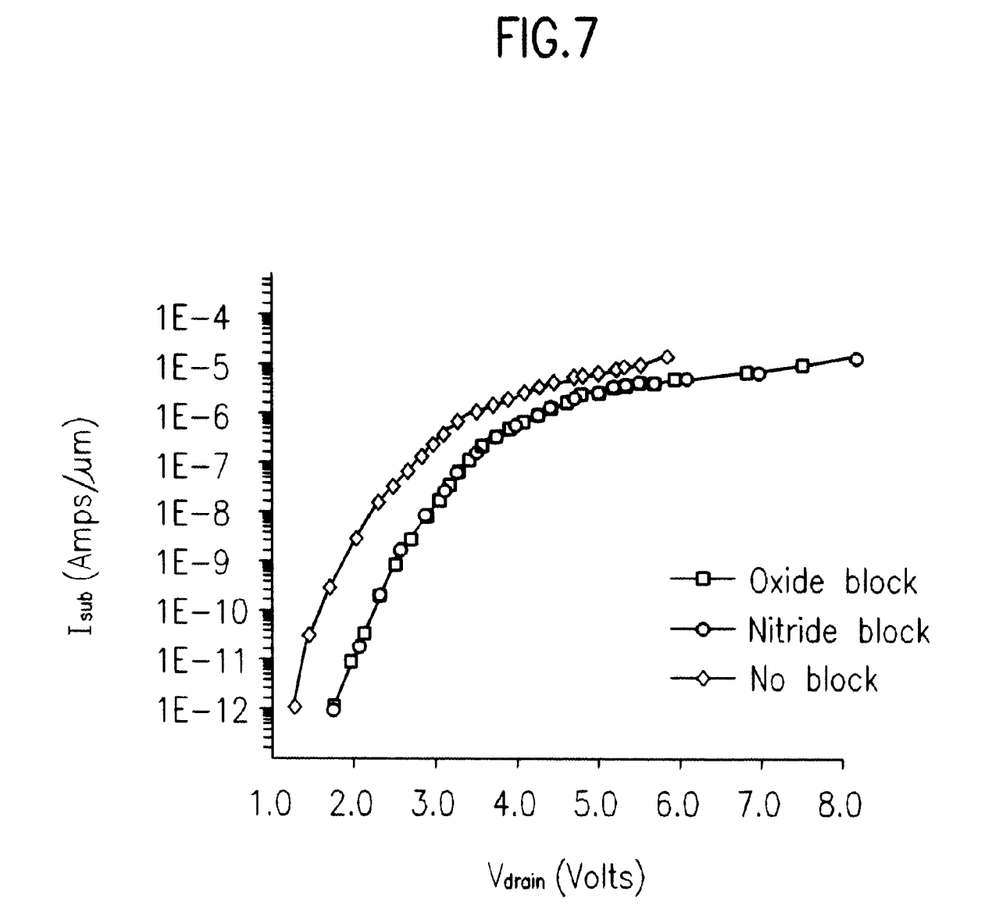
FIG. 7 illustrates a comparison of substrate current characteristics of a related art LDD MOSFET without a barrier block and an MOSFET of the present invention with a barrier block; and, FIG. 8 illustrates a comparison of electric field characteristics in an MOSFET channel of a related art LDD MOSFET without a barrier block and an MOSFET of the present invention with a barrier block.

FIG. 7 illustrates a comparison of substrate current characteristics of a related art LDD MOSFET without a barrier block and an MOSFET of the present invention with a barrier block, wherefrom it can be known that the barrier block of the present invention with an insulating body therein has a substrate current substantially smaller than the related art LDD MOSFET without a barrier block.

Figure 8:
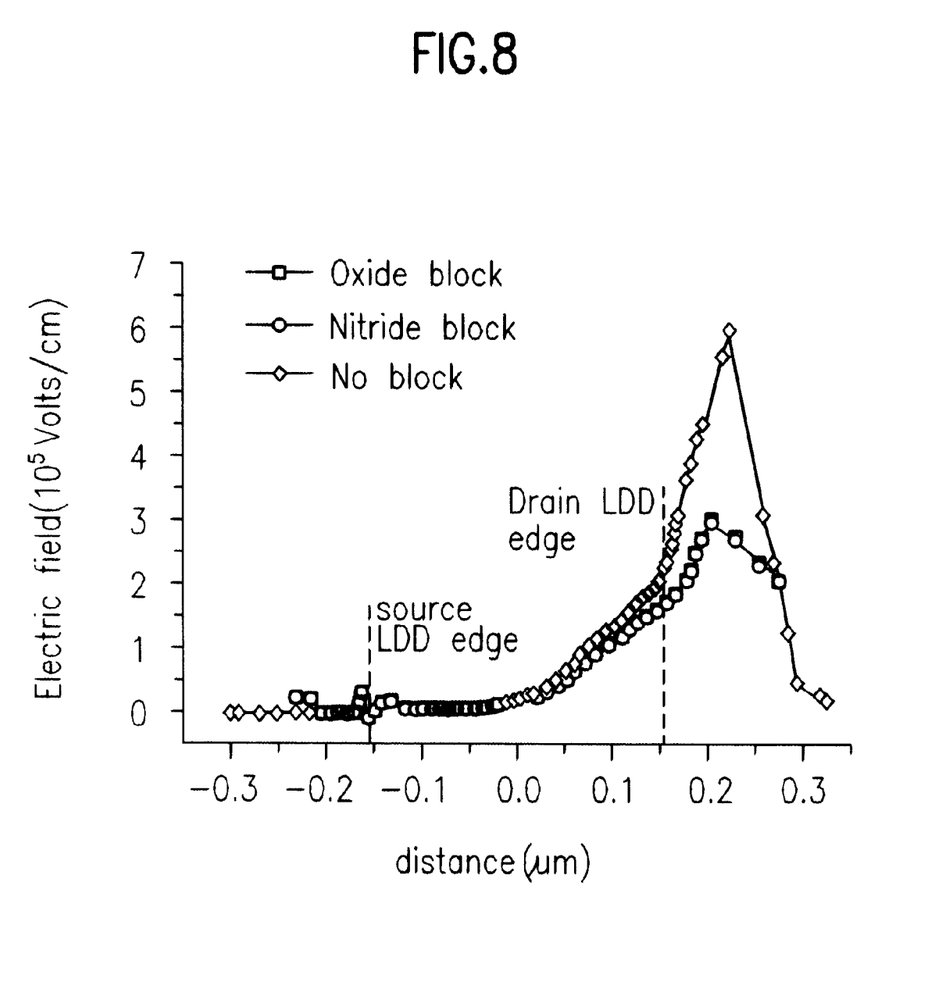

FIG. 8 illustrates a comparison of electric field characteristics in an MOSFET channel of a related art LDD MOSFET without a barrier block and an MOSFET of the present invention with a barrier block, wherefrom it can be known that an electric field of the device of the present invention is significantly reduced in the vicinity of drain edges in a current path direction because a carrier flow of the device of the present invention deviates substantially from a channel field direction.

The semiconductor device and the method for fabricating the same as has been explained has the following advantages.

The semiconductor device of the present invention can reduce the hot carrier effect, thereby reducing a device degradation and significantly improving a device reliability.

The simple process for embodying the semiconductor device of the present invention allows an easy application to an ULSI (Ultra-Large-Scale Integration) fabrication.

It will be apparent to those skilled in the art that various modifications and variations can be made in the semiconductor device and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A semiconductor device having a gate electrode over a substrate, comprising:

source/drain regions in the substrate on both sides of the gate electrode, wherein the source/drain regions each consist of a single region with a substantially continuous doping concentration; and, a barrier block formed in a portion of at least one of the source/drain regions spaced from the gate electrode, wherein upon application of a gate voltage to the gate electrode charge carriers flow from the source region through a channel in the substrate under the gate electrode to the drain region, and wherein the barrier block is formed of an insulator that does not allow charge carrier flow therethrough the barrier block upon the application of the gate voltage.

2. A semiconductor device as claimed in claim 1, wherein the barrier block is formed in said at least one of the source/drain regions spaced by a prescribed horizontal distance from intersections of the source/drain regions and the channel formed in the substrate by application of the gate voltage to the gate electrode.

3. A semiconductor device as claimed in claim 1, wherein the barrier block is formed of said insulator with a high permittivity.

4. A semiconductor device as claimed in claim 3, wherein the barrier block is formed of silicon oxide or silicon nitride.

5. A semiconductor device as claimed in claim 1, wherein the barrier block is formed by doping an impurity opposite to an impurity doped in the source/drain regions.

6. A semiconductor device comprising:
   a first conduction type substrate;
   a channel in the first conduction type substrate;
   a gate insulating film formed on the channel in the first conduction type substrate;
   a gate electrode formed on the gate insulating film;
   second conduction type impurity regions formed in regions of the substrate on both sides of the gate electrode adjacent to the channel and with the channel therebetween;
   a barrier block formed in a portion of each of the second conduction type impurity regions spaced apart from interfaces between each of the second conduction type impurity regions and the channel; and,
   source/drain electrodes formed in contact with the second conduction type impurity regions, respectively.

7. A semiconductor device as claimed in claim 6, wherein the first conduction type is a p type, and the second conduction type is an n type.

8. A semiconductor device as claimed in claim 6, wherein the first gate insulating film is an oxide film.

9. A semiconductor device as claimed in claim 6, wherein sides of the gate insulating film determine a first plane, wherein the barrier block is not below the gate insulating film, and wherein the barrier block is in the second conductivity type region spaced by a prescribed horizontal distance from the first plane.

10. A semiconductor device as claimed in claim 6, wherein the barrier block is an insulator with a high electric permittivity.

11. A semiconductor device as claimed in claim 6, wherein the barrier block is formed of silicon oxide or silicon nitride.

12. A semiconductor device as claimed in claim 6, wherein the barrier block is formed by doping a first conduction type impurity.

13. The semiconductor device of claim 1, further comprising:
   a source electrode and a drain electrode over the substrate, wherein the source and drain electrodes are coupled to the source/drain regions, respectively;
   a gate insulating film under the gate electrode; and
   sidewall spacers adjacent sides of the gate electrode, wherein the barrier block is formed in the source drain regions under a portion of the sidewall spacers.

14. The semiconductor device of claim 1, wherein the barrier block operates to bypass charge carriers and form a current path around each of the barrier blocks upon enabling the semiconductor device.

15. The semiconductor device of claim 1, wherein the barrier block has a rectangular cross-section in the source/drain regions.

16. The semiconductor device of claim 6, wherein the barrier blocks have a rectangular cross-section in the source/drain regions, and wherein the barrier blocks operate to bypass charge carriers and form a current path around each of the barrier blocks upon application of a turn-on voltage for the gate electrode.

17. The semiconductor device of claim 6, wherein the barrier blocks have a rectangular cross-section in the source/drain regions, and wherein the gate voltage enables the semiconductor device.

18. The semiconductor device of claim 6, wherein the second conduction type impurity regions each consist of a single region with a substantially uniform doping concentration.

19. A semiconductor device, comprising:
   a first conduction type substrate;
   a gate insulating film over a region of the first conduction type substrate;
   a gate electrode on the gate insulating film;
   second conduction type source/drain regions in the substrate on both sides of the gate electrode;
   a insulator region in a portion of at least one of the source/drain regions, wherein charge carriers travel along a first horizontal direction in a channel that couples the source/drain regions upon application of a gate voltage to the gate electrode, wherein the insulator region is separated from the channel by a prescribed distance in the first horizontal direction.

20. The semiconductor device of claim 19, wherein the source/drain regions each consist of a single region with a substantially uniform doping concentration.

21. The semiconductor device of claim 19, wherein the insulator region is a barrier block that does not allow charge carrier flow therethrough upon application of the gate voltage so that the charge carriers form a current path around each of the barrier blocks upon application of the gate voltage.

22. The semiconductor device of claim 19, wherein an electric field fringing effect of insulator regions in the source and drain regions reduce an electric field in a sufficient vicinity of source and drain junctions to decrease a hot carrier effect.

* * * * *